United States Patent [19]
Ueki

[11] Patent Number: 5,363,101
[45] Date of Patent: Nov. 8, 1994

[54] ANALOG TO DIGITAL CONVERTER

[75] Inventor: Masaaki Ueki, Tokyo, Japan

[73] Assignee: Sony Corporation, Tokyo, Japan

[21] Appl. No.: 116,590

[22] Filed: Sep. 7, 1993

[30] Foreign Application Priority Data

Sep. 7, 1992 [JP] Japan .................. 4-238238

[51] Int. Cl.$^5$ .................................................. H03M 3/00
[52] U.S. Cl. ................................................... 341/143
[58] Field of Search ............... 341/143, 155, 156, 166; 375/27, 28

[56] References Cited

U.S. PATENT DOCUMENTS 5,073,777  12/1991  Fukuhara et al. ............... 341/131
5,196,852   3/1993  Galton ............................ 341/143

*Primary Examiner*—Brian K. Young
*Attorney, Agent, or Firm*—Jay H. Maioli

[57] ABSTRACT

Analog audio signals supplied via an analog signal input terminal 1 are translated in parallel via a first $\Delta\Sigma$ modulator 2 and a second $\Delta\Sigma$ modulator 3 into digital audio data which are summed together by an additive node 4. The resulting sum data is attenuated in level by an attenuator 5 and translated by a decimation filter 6 into audio data having a predetermined number of bits and resulting audio data is outputted via an audio data output terminal 7. There is no necessity of providing a decimation filter for each $\Delta\Sigma$ modulator, so that the number of components may be reduced and the circuit may be simplified in construction to lower production costs. Besides, there is no necessity of re-quantizing the audio data at an output stage so that no quantization noise is produced to enable the S/N ratio to be improved by a theoretical value of 3 dB.

5 Claims, 3 Drawing Sheets

ANALOG TO DIGITAL CONVERTER

BACKGROUND OF THE INVENTION

1. Field of the Invention

This invention relates to an analog to digital converter which employs plural ΔΣ modulators so as to be advantageously employed for e.g. a digital audio tape recorder. More particularly, it relates to an analog to digital converter which, while employing plural ΔΣ modulators, is able to simplify the circuit construction as well as to improve the S/N ratio.

2. Related Art

There is currently known a digital audio tape recorder (DAT) for converting analog audio signals supplied from external equipment, such as a CD player, into digital data and recording or reproducing the audio data on or from a magnetic tape.

The DAT is known to suffer from deterioration in sound quality and recording/playback noise only to a limited extent because it records and reproduces analog audio signals after translation into digital audio data.

A conventional analog to digital converter (A/D converter) comprises a first ΔΣ modulator 101 and a second ΔΣ modulator 103, supplied with analog audio signals in parallel, a first decimation filter 102 connected in series with the first ΔΣ modulator 101, a second decimation filter 104 connected in series with the second ΔΣ modulator 103, an additive node 105 for summing output data from the first ΔΣ modulator 101 and output data from the second ΔΣ modulator 103, an attenuator 106 for attenuating audio data from the additive node by one half and a quantizer 107 for re-quantizing audio data from attenuator 106, as shown in FIG. 1, to improve the S/N ratio.

The audio signals are supplied via an input terminal 100 to the first ΔΣ modulator 101 and the second ΔΣ modulator 103 of the A/D converter.

The above-mentioned first ΔΣ modulator 101 samples and quantizes the audio signals with sampling clocks of e.g. 3.072 MHz or 48 kHz×64 to translate the audio signals into 1-bit audio data which is supplied to the first decimation filter 102.

Similarly, the second ΔΣ modulator 103 generates 1-bit audio data which is supplied to the second decimation filter 104.

Meanwhile, the ΔΣ modulators 101 and 103 translate the quantization errors generated on quantization into analog data which is subtracted from audio signals supplied via input terminal 100 for eliminating quantization errors.

The first decimation filter 102 eliminates, from the 1-bit audio data, the high-frequency noise generated on ΔΣ modulation and the high-frequency noise mixed into the audio signals, while translating the 1-bit audio data into 16-bit 48 kHz audio data which is supplied to the additive node 105. Similarly, the second decimation filter 104 translates the 1-bit audio data into 16-bit 48 kHz audio data which is supplied to the additive node 105.

The additive node 105 sums the 16-bit 48 kHz audio data supplied from the first decimation filter 102 and 16-bit 48 kHz audio data supplied from the second decimation filter 104 to supply the summed audio data to attenuator 106.

By the operation of summing e.g. M-bit audio data from the first and second decimation filters 102, 104 by the additive node 105, a 1-bit carry is produced at the MSB so that output audio data from additive node 105 is (M+1) bit audio data. For this reason, the audio data from the additive node 105 is supplied to attenuator 106.

The attenuator 106 executes a division by multiplying the audio data by $\frac{1}{2}$. The resulting quotient data is supplied to quantizer 107.

The quantizer 107 re-quantizes the audio data from attenuator 106 and restores the (M+1) bit data from node 105 to the original M-bit data which is output-ted at an output terminal 108.

Since the above-described A/D converter sums audio data from the first and second ΔΣ modulators 101, 103 at the additive node 105, the S/N ratio of the output audio data from output terminal 108 may be improved as a principle by 3 dB.

Although with the above-described conventional A/D converter it is possible as a principle to improve the S/N ratio of the audio data by 3 dB, since in-phase noise components are also summed when the two audio data are summed together at the additive node 105, the in-phase noise components are doubled in signal level.

Besides, since the carry produced by the summing operation is compensated by re-quantization by the quantizer 107, the re-quantization noise produced, with the result that the S/N ratio was deteriorated, should be improved by 3 dB.

The result is that the summing operation by the two ΔΣ modulators 101, 103, is only of small import.

In addition, since it is necessary to provide a decimation filter for each of the ΔΣ modulators 101, 103, the number of component parts is increased with consequently increased circuit scale and costs.

SUMMARY OF THE INVENTION

In view of the above-described problem of the prior art, it is an object of the present invention to provide an A/D converter whereby the number of the component parts, the circuit scale and costs may be diminished and whereby the in-phase components may be removed for improving the S/N ratio of output audio data.

According to the present invention, there is provided an analog to digital converter comprising a plurality of ΔΣ modulators for translating analog signals from outside into digital signals in parallel and outputting the resulting translated data, addition means for summing plural digital data supplied from the ΔΣ modulators for generating sum data and outputting the sum data, attenuating means for dividing the sum data from the addition means by a number equal to the number of the ΔΣ modulators for generating quotient data and outputting the quotient data, and a decimation filter for translating the quotient data from the attenuating means into digital data having a predetermined number of bits larger than the number of bits of the quotient data, and outputting the digital data.

The plural ΔΣ modulators of the A/D converter according to the present may comprise two ΔΣ modulators, that is a first ΔΣ modulator and a second ΔΣ modulator.

According to the present invention, there is also provided an analog to digital converter comprising a first ΔΣ modulator for translating analog signals supplied from outside into digital data and outputting the digital data, phase inverting means for phase-inverting the analog signals supplied from outside and outputting the phase-inverted analog signals, a second ΔΣ modulator for translating the phase-inverted analog signals from the phase inverting means into digital data and outputting the digital data, sign-inverting addition means for inverting the sign of the digital data converted from the phase-inverted analog signals by the second $\Delta\Sigma$ modulator and summing the sign-inverted digital data to the digital data from the first $\Delta\Sigma$ modulator for generating sign-inverted sum data, and outputting the sign-inverted sum data, attenuating means for dividing the sign-inverted sum data from the sign-inverting addition means by one half for generating quotient data and outputting the quotient data, and a decimation filter for translating the quotient data from the attenuating means into digital data having a predetermined number of bits larger than the number of bits of the quotient data and outputting the digital data.

The sign inverting means of the A/D converter according to the present invention comprises sign-inverting means for sign-inverting the digital data converted from the phase-inverted analog signals by the second $\Delta\Sigma$ modulator and outputting resulting sign-inverted digital data, and addition means for summing the digital data from the first $\Delta\Sigma$ modulator and the digital data from the sign-inverting means and outputting resulting sum data.

The sign inverting means of the A/D converter according to the present invention comprises subtracting means for subtracting the digital data converted from the phase-inverted analog signals by the second $\Delta\Sigma$ modulator from the output digital data of the first $\Delta\Sigma$ modulator.

The A/D converter according to the present invention comprises plural $\Delta\Sigma$ modulators for translating analog signals from outside into digital data in parallel to transmit the digital data to addition means. The addition means sum the digital data supplied from the $\Delta\Sigma$ modulators to transmit resulting sum data to attenuating means which divide the sum data from the addition means by a number equal to the number of the $\Delta\Sigma$ modulators to generate quotient data which is supplied to a decimation filter. The decimation filter translates the quotient data from the attenuating means into digital data having a predetermined number of bits larger than the number of bits of the quotient data and outputs the produced digital data.

The plural $\Delta\Sigma$ modulators of the A/D converter according to the present invention may comprise, as two $\Delta\Sigma$ modulators, a first $\Delta\Sigma$ modulator and a second $\Delta\Sigma$ modulator.

With the A/D converter according to the present invention, the first $\Delta\Sigma$ modulator translates the analog signals from outside into digital data which is supplied to a sign-inverting addition means. The phase-inverting means phase-inverts analog signals supplied from outside to supply the phase-inverted analog signals to the second $\Delta\Sigma$ modulator. The second $\Delta\Sigma$ modulator translates the phase-inverted analog signals from the second $\Delta\Sigma$ modulator into digital signals which are transmitted to the sign-inverting addition means. The sign-inverting addition means sign-inverts the digital data converted from the phase-inverted analog signals by the second $\Delta\Sigma$ modulator and sums the resulting sign-inverted data to the digital data from the first $\Delta\Sigma$ modulator to generate sign-inverted sum data which is supplied to the attenuation means. The attenuation means divides the sign-inverted sum data from the sign-inverting addition means by one half to generate quotient data which is supplied to the decimation filter. The decimation filter translates the quotient data into digital data having a predetermined number of bits larger than the number of bits of the quotient data and outputs the resulting digital data.

Besides, with the A/D converter according to the present invention, the sign-inverting addition means is made up of sign-inverting means and addition means. The sign-inverting means inverts the sign of digital data corresponding to the phase-inverted analog signals outputted from the second $\Delta\Sigma$ modulator to transmit the resulting digital data to addition means. The addition means sums the digital data from the first $\Delta\Sigma$ modulator and the digital data corresponding to the phase-inverted analog signal from the sign-inverting means to generate the sign-inverted sum data.

On the other hand, with the A/D converter according to the present invention, the sign-inverting addition means comprises subtraction means which subtracts the digital data corresponding to the phase-inverted analog signals outputted from the second $\Delta\Sigma$ modulator from the output digital data from the first $\Delta\Sigma$ modulator to generate the sign-inverted sum data.

Meanwhile, the basic technical concept of the present invention consists of an arrangement in which digital data from plural $\Delta\Sigma$ modulators are summed together and the resulting sum data are divided by a number equal to the number of the $\Delta\Sigma$ modulators to transmit the resulting data to the decimation filter so that only one decimation filter suffices while re-quantization at an output side may be eliminated to suppress generation of the re-quantization noise to improve the S/N ratio.

The basic technical concept of the present invention consists of an arrangement in which the above-mentioned summation is carried out after elimination of the noise components in the output digital data from the $\Delta\Sigma$ modulators so that power source noise or in-phase noise components may be removed to prevent the in-phase noise components from being doubled in level to improve the S/N ratio.

The circuit arrangements shown in the above-described embodiments are merely exemplary and a variety of modifications may be made within the scope of the above defined technical concept of the present invention. For example, plural stages of circuits for eliminating the in-phase components shown in FIGS. 5 and 6 may be provided and the digital data from the respective stages may be summed together so as to be subsequently supplied to the decimation filter.

With the A/D converter according to the present invention, since digital data from the plural $\Delta\Sigma$ modulators are summed together by the additive node before being supplied to the decimation filter, there is no necessity of providing a decimation filter for each of the plural $\Delta\Sigma$ modulators, so that the number of component parts may be diminished to simplify the circuit as well as to lower production costs.

Besides, the number of output bits of the decimation filter is larger than that of the attenuating means, so that there is no necessity of adjusting the number of bits by re-quantization even if carry is produced in the digital data as a result of summation. Consequently, the quantization noise is not produced and hence the S/N ratio of output digital data may be improved by $3 \times \log_2 n$ dB.

By providing two $\Delta\Sigma$ modulators, namely the first and second $\Delta\Sigma$ modulators, it becomes possible with the A/D converter of the present invention to improve the S/N ratio of output digital data by a theoretical value of e.g. 3 dB. Besides, the number of component parts may be reduced and the circuit arrangement may be simplified to lower production costs.

On the other hand, with the A/D converter according to the present invention, since in-phase noise components contained in digital data from the first and second ΔΣ modulators are removed by sign-inverting addition means, and the digital data freed of the noise components are summed together, with the resulting sign-inverted sum data being then attenuated by attenuating means and being formed into digital data of a predetermined number of bits by the decimation filter, the effects similar to the above-described effects may be achieved. Besides, since the in-phase noise components such as power source noise may be removed and only the digital data from the ΔΣ modulators are summed together, it becomes possible to improve the S/N ratio further.

In addition, with the A/D converter according to the present invention, the phase inverting means in the sign-inverting addition means inverts the phase of the analog signals to supply the phase-inverted signals to the digital data from the second sign-inverting means to generate the sign-inverted addition data, with the result that the S/N ratio may be improved further to achieve the favorable results mentioned above.

Finally, with the A/D converter according to the present invention, the subtractive means subtracts output digital data of the second ΔΣ modulator from output digital data of the first ΔΣ modulator to generate the above-mentioned sign-inverted addition data to improve the S/N ratio further.

DESCRIPTION OF THE PREFERRED EMBODIMENTS

Figure 1:
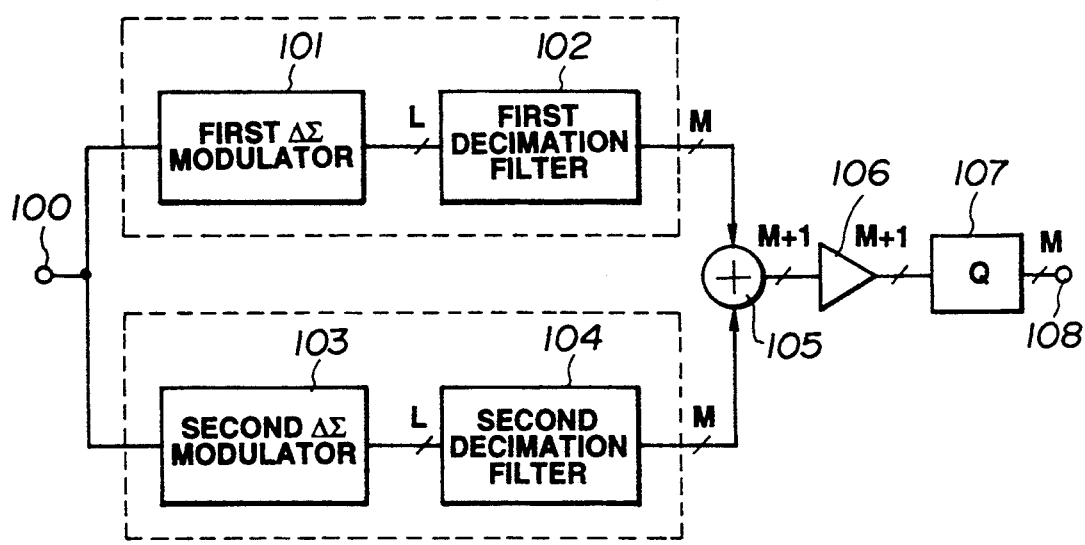
FIG. 1 is a block diagram showing a conventional A/D converter.

Referring to the drawings, an analog to digital (A/D) converter according to a first embodiment of the present invention is explained in detail.

Figure 2:
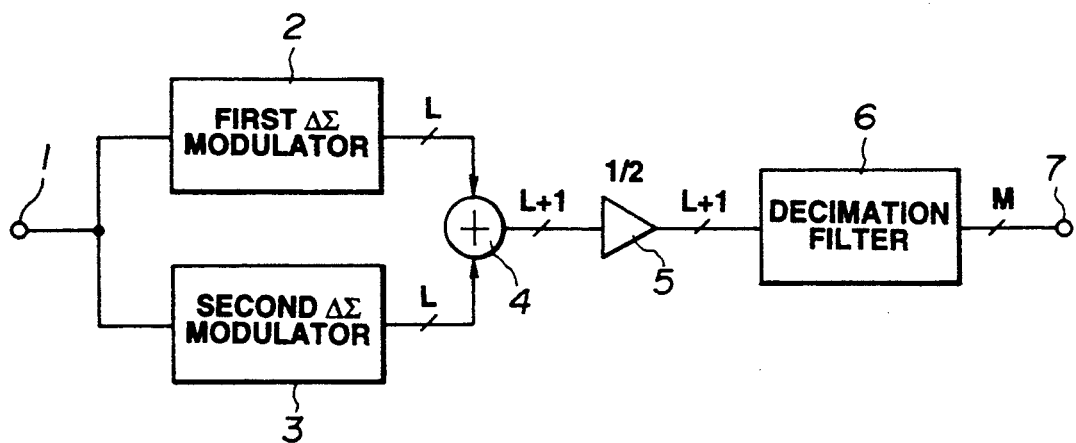
FIG. 2 is a block circuit diagram of an A/D converter according to a first embodiment of the present invention.

The A/D converter according to the first embodiment comprises first and second ΔΣ modulators 2, 3, connected to an audio signal input terminal 1, to which audio analog signals are supplied, an additive node 4, as addition means, connected to output terminals of the first and second ΔΣ modulators 2, 3, an attenuator 5, an attenuating means, connected to an output terminal of the additive node 4, a decimation filter 6 connected to an output terminal of the attenuator 5, and an audio data output terminal 7 connected to an output terminal of the decimation filter 6, as shown in FIG. 2.

Figure 3:
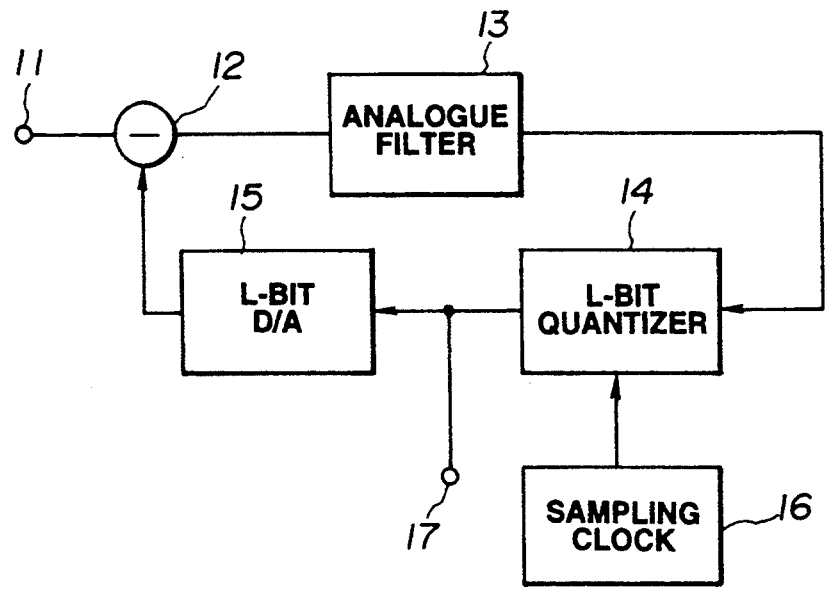
FIG. 3 is a block circuit diagram for illustrating a concrete circuit construction of ΔΣ modulators provided in the A/D converter according to the first embodiment.

Each of the first and second ΔΣ modulators 2, 3 comprises a subtractive node 12 connected to an input terminal 11 to which the audio signal is supplied, an analog filter 13 connected to an output terminal of subtractive node 12, an L-bit quantizer 14 connected to an output terminal of the analog filter 13, L being a natural number, a sampling clock generator 16, connected to a sampling clock input terminal of the L-bit quantizer 14, an audio data output terminal 17, connected to the output terminal of the L-bit quantizer 14, and an L-bit digital to analog (D/A) converter 15 connected to an output terminal of the L-bit quantizer 14, as shown in FIG. 3. The L-bit D/A converter 15 has its output terminal connected to subtractive node 12.

The operation of the A/D converter according to the first embodiment of the present invention is hereinafter explained.

Analog audio signals are supplied via audio signal input terminal 1 to the first and second ΔΣ modulators 2, 3.

The first and second ΔΣ modulators 2, 3 translate the audio signals into digital audio data to transmit the resulting digital data to additive node 4.

Specifically, the audio signals are supplied to subtractive unit 12 via input terminal 11 shown in FIG. 3. The subtractive unit 12 is supplied with analog quantization error feedback signals, translated from quantization errors as later explained. The subtractive unit 12 subtracts the quantization error signals from the audio signals supplied via the input terminal 11 to transmit the resulting subtraction signals to analog filter 13.

The analog filter 13 eliminates noise components from the subtraction signals to transmit the resulting signals to L-bit quantizer 14.

The L-bit quantizer 14 samples and quantizes the subtraction signals from analog filter 13 with sampling clock 16 to generate e.g. L-bit digital audio data which is then supplied to L-bit. D/A converter 15 and also to the additive node 4 (FIG. 2) via output terminal 17.

The L-bit D/A converter 15 translates quantization error components, generated on quantization by L-bit quantizer 14, into analog quantization error signals which are supplied to the subtractive unit 12.

Subsequently, the first and second ΔΣ modulators 2, 3 reiterate the above-mentioned sequence of operations.

The additive node 4 adds the L-bit audio data supplied from the first ΔΣ modulator 2 and the L-bit audio data supplied from the second ΔΣ modulators 3 to supply the resulting sum data to attenuator 5.

Since the sum data formed at the additive node 4 is the sum of two audio data from the first and second ΔΣ modulators 2, 3, the sum data is at a level twice that of the audio data.

Thus the attenuator 5 attenuates the sum data to a one-half level to form attenuated data which is supplied to decimation filter 6.

The decimation filter 6 generates M-bit audio data from the L-bit attenuated data, where L<M, which M-bit data is outputted at output terminal 7.

If the audio data from the first and second ΔΣ modulators 2, 3 are summed at the additive node 4, the output addition data from the additive node 4 becomes (L+1) bit data by carry. However, since the number of output bits of the decimation filter is larger than the number of bits of the addition data which has undergone the carry, audio data having a predetermined number of bits may be outputted without the necessity of processing the attenuated data by a quantizer for achieving the predetermined number of bits by re-quantization.

Thus it becomes possible to omit the quantizer for re-quantization to remove any consequent quantization noise to improve the S/N ratio by e.g. a theoretical value of 3 dB.

Besides, since the audio data from the first and second $\Delta\Sigma$ modulators 2, 3 are summed together at the additive node 4 before being supplied to the decimation filter 6, it suffices to provide only one decimation filter without regard to the number of the $\Delta\Sigma$ modulators. The result is that there is no necessity of providing a decimation filter for each of the $\Delta\Sigma$ modulators so that it becomes possible to diminish the number of component parts and simplify the circuit construction to lower production costs.

The A/D converter of the present first embodiment has two $\Delta\Sigma$ modulators 2, 3. The A/D converter of the second embodiment now to be described includes two or more $\Delta\Sigma$ modulators.

Figure 4:
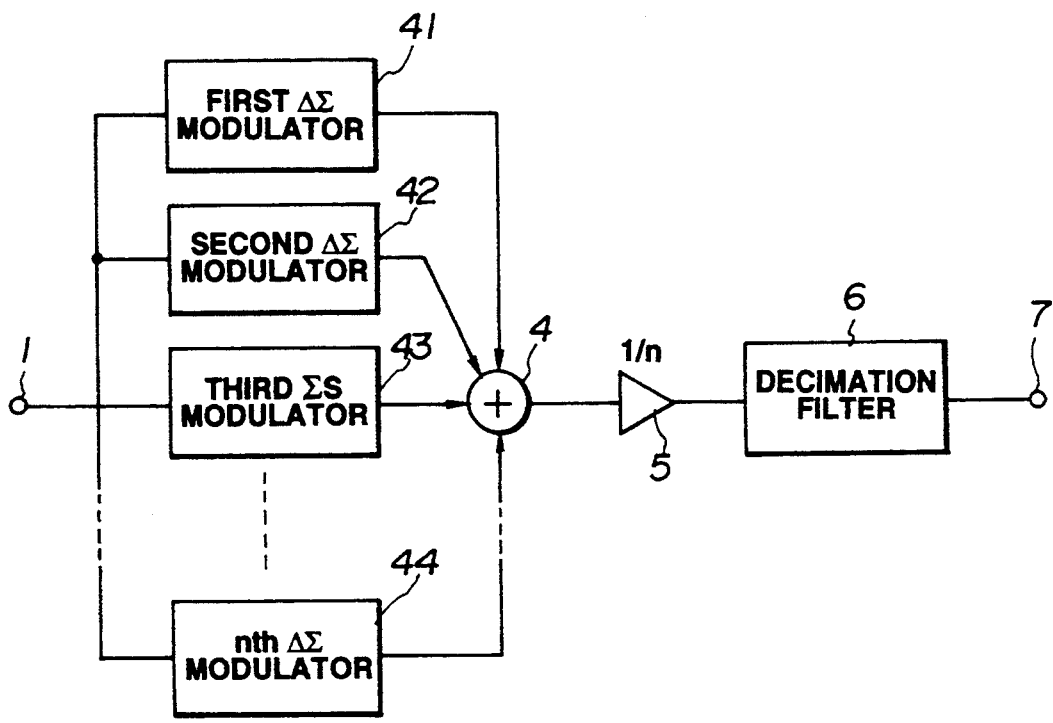
FIG. 4 is a block circuit diagram of an A/D converter according to a second embodiment of the present invention.

Thus the A/D converter according to the second embodiment includes 1st to nth $\Delta\Sigma$ modulators 41 to 44, output terminals of which are connected to an additive node 4, as shown in FIG. 4.

Meanwhile, the parts or components which are the same as those of the A/D converter of the first embodiment are indicated by the same numerals and corresponding description is omitted for simplicity.

With the A/D converter of the present second embodiment, audio signals supplied at the audio signal input terminal 1 are translated in parallel into audio data by the 1st to nth $\Delta\Sigma$ modulators 41 to 44, where n is a natural number, these audio data then being summed together at the additive node 4. The addition data resulting form the addition are supplied to the attenuator 5 shown in FIG. 2. The manner of data processing downstream of the attenuator 5 is similar to that of the A/D converter according to the first embodiment described above.

With the A/D converter of the present second embodiment, since the audio data formed by the n number of $\Delta\Sigma$ modulators are summed together, the S/N ratio may be improved by $3 \times \log_2 n$ (dB) as compared to that with the A/D converter of the first embodiment.

Besides, since the audio data from the n number of $\Delta\Sigma$ modulators are summed together before being supplied via attenuator 5 to the decimation filter 6, as in the A/D converter according to the above-described first embodiment, it is unnecessary to provide a decimation filter for each of the $\Delta\Sigma$ modulators to enable the number of component parts to be diminished to simplify the circuit and lower production costs.

With the L number of bits of the output audio data from each of the $\Delta\Sigma$ modulators 41 to 44 the number of input bits to the decimation filter 6 equal to $L + \log_2 n$ suffices.

It is noted that, with the A/D converter of the above-described first embodiment, since the audio data from the first and second $\Delta\Sigma$ modulators 2, 3 are directly summed together by the additive node 4 shown in FIG. 2, the in-phase components generated on digitation of the audio signals by the first and second $\Delta\Sigma$ modulators 2, 3 are also summed together, meaning that the in-phase noise components are also doubled in level.

Meanwhile, a similar problem is raised with the A/D converter according to the second embodiment.

With this in view, with the A/D converter according to the third embodiment, the in-phase components are eliminated and only the audio data are summed together for doubling only the audio data in amplitude for improving the S/N ratio.

Figure 5:
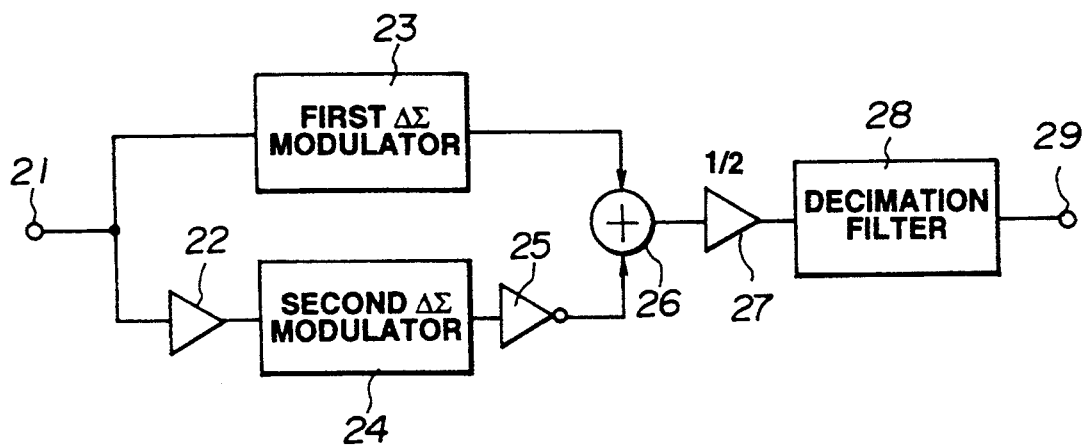
FIG. 5 is a block circuit diagram of an A/D converter according to a third embodiment of the present invention.

That is, the A/D converter according to the third embodiment, comprises an audio signal inverting circuit 22, as phase inverting means, connected to an audio signal input terminal 21, a first $\Delta\Sigma$ modulator 23 connected to the audio signal input terminal 21, a second $\Delta\Sigma$ modulator 24 connected to an output terminal of the audio signal inverting circuit 22, an audio data inverting circuit 25, as sign changing means, connected to an output terminal of the second $\Delta\Sigma$ modulator 24, an additive node 26 connected to both an output terminal of the first, $\Delta\Sigma$ modulator, or 23 and an output terminal of the audio data inverting circuit 25, an attenuator 27 connected to an output terminal of the additive node 26, a decimation filter 28 connected to an output terminal of the attenuator 27 and an audio data output terminal 29 connected to an output terminal of the decimation filter 29, as shown in FIG. 5.

Meanwhile, the audio data inverting circuit, 25 and the additive node 26 make up an sign-inverting addition means.

The operation of the above-described A/D converter according to the third embodiment, is hereinafter explained.

Analog audio signals are supplied via audio signal input terminal 21 to the first $\Delta\Sigma$ modulator 23 and to the audio signal inverting circuit 22.

Similar to the first and second $\Delta\Sigma$ modulators 2, 3, shown in FIG. 2, the first $\Delta\Sigma$ modulator 23 digitizes the audio signals to generate audio data which is supplied to the additive node 26. Meanwhile, the audio data contains the quantization noise produced on quantization of the audio signals.

On the other hand, the audio signal inverting circuit 22 inverts the sign of the audio signals to transmit the sign-inverted audio signals to the second $\Delta\Sigma$ modulator 24.

Similar to the first $\Delta\Sigma$ modulator 23, the second $\Delta\Sigma$ modulator 24 digitizes the phase-inverted audio signals to generate audio data which is supplied to the audio data inverting circuit 25. Meanwhile, data produced by the second $\Delta\Sigma$ modulator 24 contain the quantization noise produced on quantization of the phase-inverted audio signals.

That is, output audio data of the second $\Delta\Sigma$ modulator 24 contain both the audio data phase-inverted with respect to the output audio data from the first $\Delta\Sigma$ modulator 23 and the quantization noise in phase with the quantization noise contained in the output audio data of the first $\Delta\Sigma$ modulator 23.

The audio data inverting circuit 25 inverts the sign of the audio data supplied from the second $\Delta\Sigma$ modulator 24 to supply the sign-inverted audio data to the additive node 26.

Consequently, the audio data in phase with the audio signals supplied to the first $\Delta\Sigma$ modulator 23, produced by further inverting the phase of the phase-inverted audio signals, and the phase-inverted quantization noise, are supplied to the additive node 26.

The additive node 26 sums the audio data from the first $\Delta\Sigma$ modulator 23 and the audio data from the audio data inverting circuit 25 to generate sum data which is supplied to attenuator 27. However, among the data supplied from the audio data inverting circuit 25 to the additive node 26, only the quantization noise is inverted in phase, as mentioned above, so that the in-phase noise component is eliminated by such addition and hence only the audio data proper is doubled in amplitude so as to be supplied to attenuator 27.

The attenuator 27 attenuates the sum data level to one half to generate attenuated data which is supplied to decimation filter 28.

The decimation filter 28 translates the attenuated data into a predetermined number of bits to generate audio data which is outputted at the audio data output terminal 29.

Since it is possible with the present A/D converter of the present third embodiment to remove in-phase noise components produced on quantization of the audio signals by the first and second $\Delta\Sigma$ modulators 23, 24, it becomes possible to improve the S/N ratio further, in addition to the effects of the above-described A/D converter of the first embodiment.

An A/D converter according to a fourth embodiment is hereinafter explained.

With the above-described A/D converter according to the third embodiment, the in-phase noise components are removed by inverting the sign of audio data containing quantization noise from the second $\Delta\Sigma$ modulator 24 by the audio data inverting circuit 25. With the A/D converter according to the fourth embodiment, the audio data inverting circuit 25 is not provided and a subtractive unit 3 shown in FIG. 6 is provided in place of the additive node 26.

Figure 6:
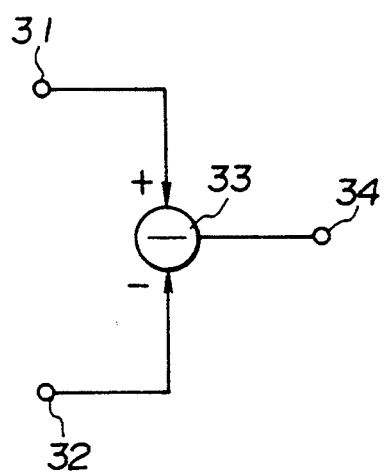
FIG. 6 is a block circuit diagram of an A/D converter according to a fourth embodiment of the present invention.

With the present embodiment, audio data from the first $\Delta\Sigma$ modulator 23 and audio data corresponding to phase-inverted audio signals from the second $\Delta\Sigma$ modulator 24 are supplied to the subtractive node 33 via input terminals 31, 32 shown in FIG. 6.

The subtractive unit 33 subtracts the audio data from the second $\Delta\Sigma$ modulator 24 from the audio data from the first $\Delta\Sigma$ modulator 23 to supply the resulting subtraction data via output terminal 34 to attenuator 27 shown in FIG. 5.

The operation downstream of the attenuator 27 is the same as that with the A/D converter according to the first to third embodiments described above and hence the corresponding description is omitted for simplicity.

The audio data supplied from the second $\Delta\Sigma$ modulator 24 to the subtractive node 33 is the audio data corresponding to the audio signals inverted in phase by the audio signal inverting circuit 22 shown in FIG. 5. Consequently, by subtracting these audio data by the subtractive unit 33 from the audio data from the first $\Delta\Sigma$ modulator 23, it becomes possible to add only audio data proper while subtracting only the in-phase components.

Consequently, with the A/D converter of the present fourth embodiment, similar to the third embodiment, the S/N ratio may be improved further, in addition to the effects achieved with the A/D converter of the first embodiment.

What is claimed is:

1. An analog to digital converter comprising
a plurality of $\Delta\Sigma$ modulators for translating analog signals from outside into digital signals in parallel and outputting the resulting translated data,
addition means for summing plural digital data supplied from said $\Delta\Sigma$ modulators for generating sum data and outputting said sum data,
attenuating means for dividing said sum data from said addition means by a number equal to the number of the plurality of $\Delta\Sigma$ modulators for generating quotient data and outputting said quotient data, and
a decimation filter for translating said quotient data from said attenuating means into digital data having a predetermined number of bits larger than the number of bits of said quotient data and outputting said digital data.

2. The analog to digital converter as claimed in claim 1 wherein said $\Delta\Sigma$ modulators are two $\Delta\Sigma$ modulators, that is a first $\Delta\Sigma$ modulator and a second $\Delta\Sigma$ modulator.

3. An analog to digital converter comprising
a first $\Delta\Sigma$ modulator for translating analog signals supplied from outside into digital data and outputting said digital data,
phase inverting means for phase-inverting the analog signals supplied from outside and outputting the phase-inverted analog signals,
a second $\Delta\Sigma$ modulator for translating the phase-inverted analog signals from said phase inverting means into digital data and outputting the digital data,
sign-inverting addition means for inverting the sign of the digital data converted from the phase-inverted analog signals by said second $\Delta\Sigma$ modulator and summing the sign-inverted digital data to said digital data from said first $\Delta\Sigma$ modulator for generating sign-inverted sum data and outputting said sign-inverted sum data,
attenuating means for dividing the sign-inverted sum data from said sign-inverting addition means by one half for generating quotient data and outputting said quotient data, and
a decimation filter for translating said quotient data from said attenuating means into digital data having a predetermined number of bits larger than the number of bits of said quotient data and outputting said digital data.

4. The analog to digital converter as claimed in claim 3 wherein said sign-inverting addition means comprises
sign-inverting means for sign-inverting the digital data converted from the phase-inverted analog signals by said second $\Delta\Sigma$ modulator and outputting resulting sign-inverted digital data, and
addition means for summing the digital data from said first $\Delta\Sigma$ modulator and the digital data from said sign-inverting means and outputting resulting sum data.

5. The analog to digital converter as claimed in claim 3 wherein said sign-inverting addition means comprises
subtracting means for subtracting the digital data converted from the phase-inverted analog signals by said second $\Delta\Sigma$ modulator from the output digital data of said first $\Delta\Sigma$ modulator.

* * * * *